United States Patent
Cho et al.

(10) Patent No.: US 10,122,347 B2
(45) Date of Patent: Nov. 6, 2018

(54) ADAPTIVE VOLTAGE SYSTEM FOR AGING GUARD-BAND REDUCTION

(71) Applicant: Intel Corporation, Santa Clara, CA (US)

(72) Inventors: Minki Cho, Hillsboro, OR (US); Jaydeep Kulkarni, Portland, OR (US); Carlos Tokunaga, Hillsboro, OR (US); Muhammad Khellah, Tigard, OR (US); James Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,913

(22) Filed: Apr. 3, 2017

(65) Prior Publication Data

US 2018/0287592 A1 Oct. 4, 2018

(51) Int. Cl.
| | | |
|---|---|---|
| *G11C 7/00* | (2006.01) | |
| *G11C 7/12* | (2006.01) | |
| *H03K 3/011* | (2006.01) | |
| *H03K 3/012* | (2006.01) | |
| *G11C 11/419* | (2006.01) | |
| *G06F 1/32* | (2006.01) | |

(52) U.S. Cl.
CPC .......... *H03K 3/011* (2013.01); *G06F 1/3275* (2013.01); *G11C 11/419* (2013.01); *H03K 3/012* (2013.01)

(58) Field of Classification Search
CPC ...... H03K 3/011; H03K 3/012; G06F 1/3275; G11C 11/419
See application file for complete search history.

(56) References Cited

U.S. PATENT DOCUMENTS

| | | | | |
|---|---|---|---|---|
| 5,726,562 A * | 3/1998 | Mizuno | ................. | G11C 11/412 323/312 |
| 6,208,171 B1 * | 3/2001 | Kumagai | ........... | H03K 19/0016 326/121 |
| 6,285,213 B1 * | 9/2001 | Makino | ............ | H03K 3/356008 326/81 |
| 6,570,439 B2 * | 5/2003 | Berthold | ................ | G11C 5/147 327/544 |
| 7,149,142 B1 * | 12/2006 | Fisher | ................... | G11C 11/412 365/229 |
| 7,200,030 B2 * | 4/2007 | Yamaoka | ............... | G11C 11/417 365/154 |
| 7,616,516 B2 * | 11/2009 | Hirayama | ............. | G11C 11/412 365/154 |
| 7,760,575 B2 * | 7/2010 | Tooher | ................. | G11C 11/413 365/154 |

(Continued)

OTHER PUBLICATIONS

Bowman, K et al., "Self-contained, path-level aging monitor apparatus and method", US patent 20130285685.

(Continued)

*Primary Examiner* — Kenneth B Wells
(74) *Attorney, Agent, or Firm* — Green, Howard & Mughal LLP

(57) ABSTRACT

An apparatus is provided which includes: a first power supply node; a second power supply node; a memory bit-cell coupled to the second power supply node; a circuitry coupled to the first and second power supply nodes, the circuitry to operate in a diode-connected mode; and a transistor coupled in parallel to the circuitry, wherein the transistor is controllable by a digital signal such that when the transistor is to turn on, it is to apply voltage and/or current stress to the memory bit-cell.

18 Claims, 10 Drawing Sheets

(56) References Cited

U.S. PATENT DOCUMENTS

| | | | |
|---|---|---|---|
| 7,952,422 B2* | 5/2011 | Chuang | G11C 5/147 327/534 |
| 9,672,902 B1* | 6/2017 | Sinangil | G11C 11/419 |
| 2005/0135162 A1* | 6/2005 | Somasekhar | G11C 5/143 365/189.06 |
| 2008/0117666 A1* | 5/2008 | Russell | G11C 8/16 365/154 |
| 2013/0328117 A1 | 12/2013 | Hommelgaard et al. | |
| 2014/0022008 A1 | 1/2014 | Noorlag et al. | |
| 2014/0223205 A1 | 8/2014 | Muthukaruppan et al. | |
| 2015/0235696 A1 | 8/2015 | Wang et al. | |
| 2015/0279438 A1* | 10/2015 | Kulkarni | G11C 7/12 365/96 |

OTHER PUBLICATIONS

Ceratti, A et al., "On-chip aging sensor to monitor NBTI effect in nano-scale SRAM", Design and Diagnostics of Electronic Circuits & Systems (DDECS), 2012.

Keane, J et al., "An Array-based odometer system for statistically significant circuit aging characterization,", JSSC 2011.

Kim, S et al., "Enabling Wide Autonomous DVFS in a 22nm Graphics Execution Core Using a Digitally Controlled Hybrid LDO/Switched-Capacitor VR with Fast Droop Mitigation", ISSCC 2015.

Kurd, N et al., "Haswell: A Family of IA 22nm Processor", ISSCC 2014.

Raychowdhury, A et al., "Tunable Replica Bits for Dynamic Variation Tolerance in 8T SRAM", Symposium on VLSI Circuit 2010.

Tokunaga, C et al., "A Graphics Execution Core in 22nm CMOS Featuring Adaptive Clocking, Selective Boosting and State-Retentive Sleep", ISSCC 2014.

Wang, J et al., "Canary replica feedback for near-DRV standby VDD scaling in a 90nm SRAM", CICC 2007.

Wang, J et al., "Standby Supply voltage minimization for Reliable nanoscale SRAM", Chap. 6, Solid state circuits technologies, INTECH.

International search Report and Written Opinion for International Patent Application No. PCT/US18/20607, dated Jun. 14, 2018.

Huard, V., "Aging-aware adaptive voltage scaling of product blocks in 28nm nodes", In: Reliability Physics Symposium (IRPS), 2016 IEEE International, Apr. 17-21, 2016.

* cited by examiner

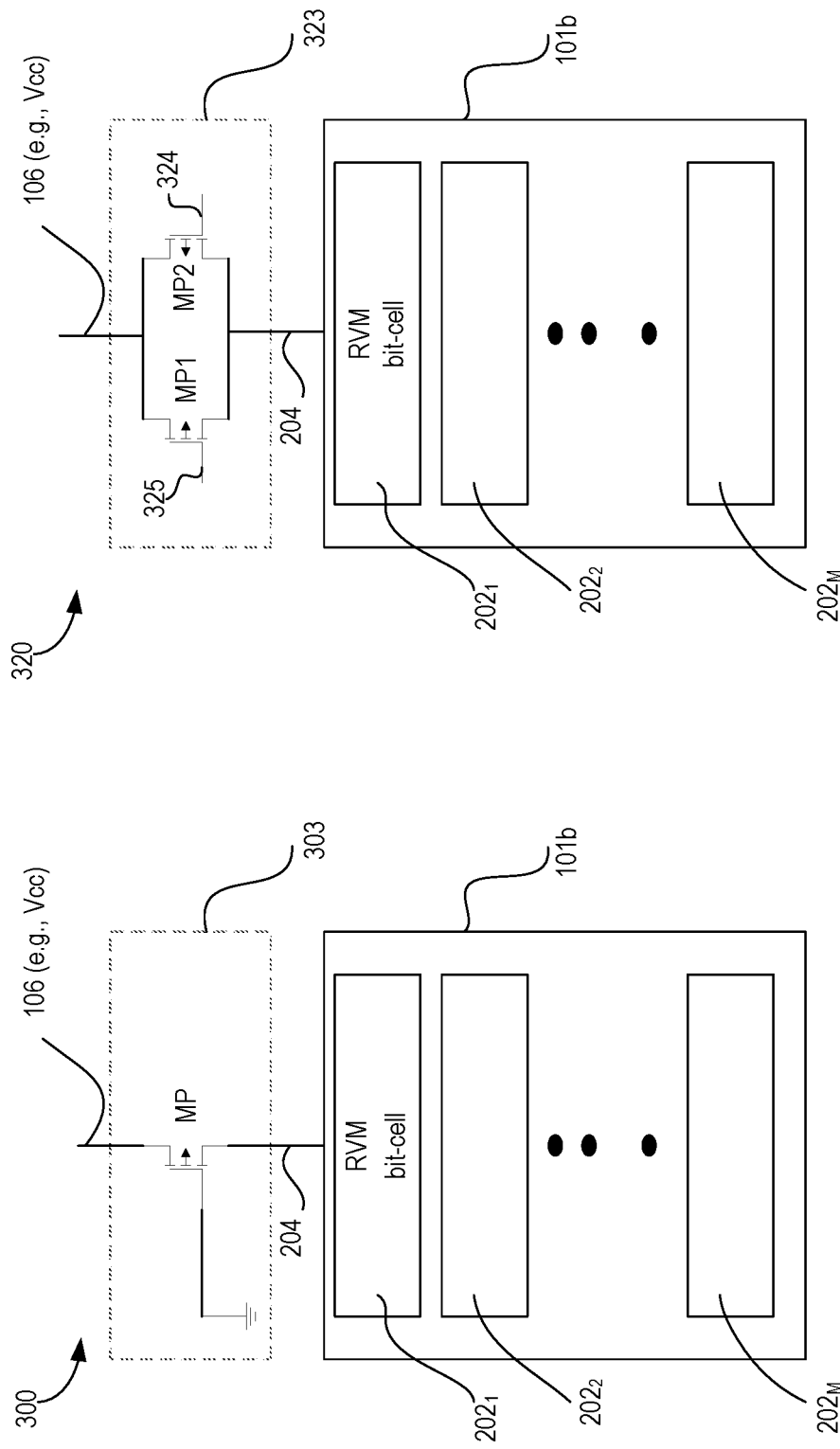

ADAPTIVE VOLTAGE SYSTEM FOR AGING GUARD-BAND REDUCTION

BACKGROUND

In advanced process technology nodes, process (P), voltage (V), and temperature (T) variations (also referred to as "PVT" variations), and aging behavior can degrade performance and reliability of a design. To mitigate these issues, modern microprocessor and/or system-on-chip (SoC) designs add fixed voltage/timing margin guardband or margin to guarantee target performance and reliability of the microprocessor or SoC. Moreover, these PVT variations and aging may be infrequent in nature. Hence, adding guardband or margin to avoid variation-caused errors hurts energy efficiency and performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3A-F illustrate RVM circuitries, according to some embodiments of the disclosure.

DETAILED DESCRIPTION

Figure 1:
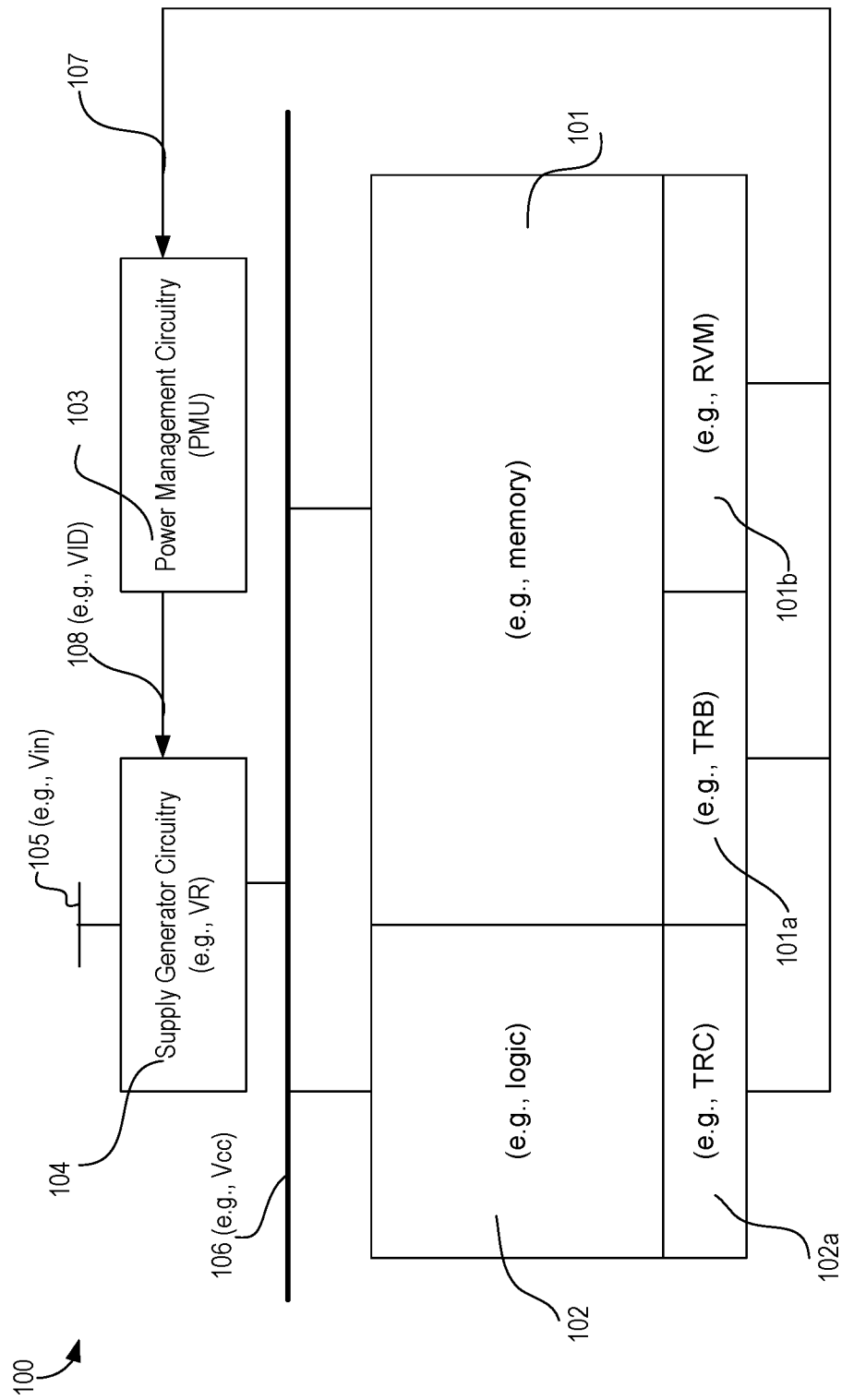
FIG. 1 illustrates a high level architecture of an adaptive voltage system, according to some embodiments of the disclosure.

Since aging effect on transistors occurs differently depending on usage and conditions by a user of an integrated circuit (IC or chip), large fixed aging guardband or margin may end up being added to even a less-aged chip (or IC), which in turn increases power consumption during the lifetime of the chip. Transistor or device aging occurs in both memory array and logic of an IC, which increases the threshold voltage of devices resulting in higher propagation delays and higher active Vmin. Here, the term "Vmin" generally refers to a minimum operating supply voltage below which the logic or memory does not function properly. For example, Vmin for a memory is the minimum supply voltage below which a memory bit-cell may lose its data or is unable to write data to it. Increasing the supply voltage to an IC or chip, however, will increase the speed of the chip's aging transistors. As such, a larger Vmin is specified for the semiconductor chip so that a sufficient amount of supply voltage is provided to the chip's transistors over the course of the chip's lifetime that permit the chip to operate at least a minimum specified clock speed for its entire life.

Additionally, in the case of a memory circuit (e.g., a static random access memory (SRAM)), as the transistors of a memory cell age, the memory cell needs to be supplied with a larger supply voltage in order to prevent the memory cell from losing its stored data. As such, a larger Vmin is specified for the semiconductor chip so that a sufficient supply voltage is applied to the memory circuit's memory cells so that they retain their data over the course of the semiconductor chip's lifetime.

Thus, the specified Vmin for a semiconductor chip is set at an artificially high power supply level over the earlier timeframe of the chip's operational lifetime. In the early stages of the chip's lifetime, the semiconductor chip's transistors are not substantially aged. As such, they could operate at a lower supply voltage. However, the minimum supply voltage is established to a higher voltage level to ensure that the transistors will receive sufficient supply voltage when they eventually age later on in the semiconductor chip's lifetime. The artificially high supply voltage that is supplied to the semiconductor chip early in its life, corresponds to inefficiency in that the semiconductor chip. This inefficiency consumes more power with the artificially high supply voltage than it otherwise needs to. Memory arrays (e.g., rows and columns of SRAM bit-cells), in the semiconductor chip, with very low activation probability are in retention mode (e.g., low power mode, standby mode, sleep mode, etc.) for the majority of the time. Hence, retention Vmin reduction/monitor are used for mitigating the aging-induced degradation.

Some embodiments describe an adaptive voltage system (AVS) using tunable replica circuits (TRC) as logic aging monitor, tunable replica bit (TRB) circuitry for memory array, and bit-cell retention Vmin monitor (RVM) circuit as memory array aging monitor. In some embodiments, the TRC detects timing margin and error in advance, and provides an output to a power management unit (PMU). In some embodiments, the TRB circuitry provides a timing margin for a memory array. While the TRC tracks the Vmin of a logic block and the TRB circuitry tracks the timing margin for a memory array, the TRC and TRB circuitries may not track a memory bit-cell retention Vmin.

Some embodiments describe a RVM circuitry for memory arrays to track the bit-cell aging across operational modes (e.g., normal mode or active mode, and low power mode or sleep mode). In some embodiments, the RVM circuitry provides an output to the PMU. In some embodiments, the PMU modulates the power supply voltage (e.g., generated by a voltage regulator, a low dropout (LDO) circuitry, a DC-DC converter, etc.) for the memory array and the logic to avoid any logic/memory failure due to aging induced degradation.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a high level architecture of an adaptive voltage system (AVS) 100, according to some embodiments of the disclosure. System 100 comprises an array of bit-cells 101, logic 102 (e.g., column multiplexers, decoders, etc.), TRB circuitry 101a, RVM circuitry 101b, TRC 102a, PMU circuitry 108, supply generator circuitry 104, input supply 105, output supply 106, monitor node 107, and supply control node 108.

In some embodiments, the array of bit-cells 101 is a memory array (e.g., content addressable memory (CAM), four transistor (4T) SRAM, 6T SRAM, 8T SRAM, register file (RF), dual-ported memory, etc.). In some embodiments, memory array 101 has associated TRB circuitry 101a and RVM circuitry 101b. In some embodiments, TRB circuitry 101a and RVM circuitry 101b may be fully integrated with the memory cells of memory array 101. In some embodiments, TRB circuitry 101a measures the speed/timing of the memory array's storage cells. In some embodiments, RVM circuitry 101b includes RVM cells which measure the Vmin needed by the memory cells of memory array 101 to keep or retain their data.

In some embodiments, logic 102 (which can be any logic in a chip) has an associated TRC 102a. In some embodiments, TRC 102a monitors the speed/timing of certain logic cells (e.g., transistors in an AND gate) in logic 102.

In some embodiments, PMU 103 (or power management controller or circuitry) is used to monitor the information or outputs of TRB circuitry 101a, RVM circuitry 101b, and TRC 102a on a regular basis (e.g., every few milliseconds, nanoseconds, and/or picoseconds) and controls the supply generator 104 to modulate the supply on one or more supply nodes. For simplicity purposes, one supply node 106 is shown as being shared for memory array 101 and logic 102. However, a semiconductor chip may have many voltage domains and different supply generators for providing supply to the different voltage domains. In that case, PMU 103 may instruct the different supply generators to adjust the supply to the different voltage domains according to monitoring circuitries such as TRB circuitry 101a, RVM circuitry 101b, and TRC 102a. In some embodiments, besides the RVM cell 101b failures, the supply voltage on node 106 can also be raised if either the TRB circuitry 101a or TRC 102a cells exhibit sufficient failures. As such, in some embodiments, each of these test cells 101a, 101b, and 102a are coupled to PMU 403 which controls the supply voltage via supply generator 404 in response to the outputs of test cells 101a, 101b, and 102a.

In some embodiments, supply generator 104 is a DC-DC converter that receives an input power supply on node 105 and generates a regulated supply on node 106. In some embodiments, supply generator 104 is a low drop-out (LDO) regulator. For example, supply generator 104 comprises a digital LDO, an analog LDO, or a combination of them. Any suitable supply generator may be used for generator 104 which is operable to modulate the supply on node 106 according to control 108.

In some embodiments, RVM circuitry 101b acts as a test cell associated with the memory array 101 that is designed to measure the minimum supply voltage at which the storage cells in the memory array 101 can reliably keep their stored information. Initially, in the early life of the semiconductor chip, RVM circuitry 101b indicates that the storage cells in the memory array 101 can retain their data with a particularly low supply voltage. In some embodiments, data from RVM circuitry 101b reaches PMU circuitry 103 via monitor node 107. In some embodiments, PMU circuitry 103 sets a low supply voltage for memory 101 and logic 102. As such, the above inefficiency is alleviated because the semiconductor chip (here, indicated by memory 101 and logic 102) is able to operate at a lower supply voltage during its early life.

Over time, as the semiconductor chip's transistors age, RVM circuitry 101b indicates that a higher supply voltage is needed on node 106 to ensure that the memory array cells will be able to keep their data. Data from the RVM circuitry 101b reaches PMU circuitry 103 which requests supply generator 104 to increase its supply voltage on node 106 to a higher voltage level. For example, PMU 103 provides a new voltage identification (VID) 108 to supply generator 104 to set the supply voltage on node 106 to a higher voltage.

This behavior increases over time with RVM circuitry 101b indicating an even higher voltage is needed and PMU circuitry 103 providing the higher voltage on node 106 over the lifetime of the semiconductor chip 100. In this manner, the aforementioned supply voltage inefficiency is avoided because the semiconductor chip 100 scales up its supply voltage on an as-needed basis rather than running its supply voltage at an end of life worst case level over its entire lifetime.

Figure 2:
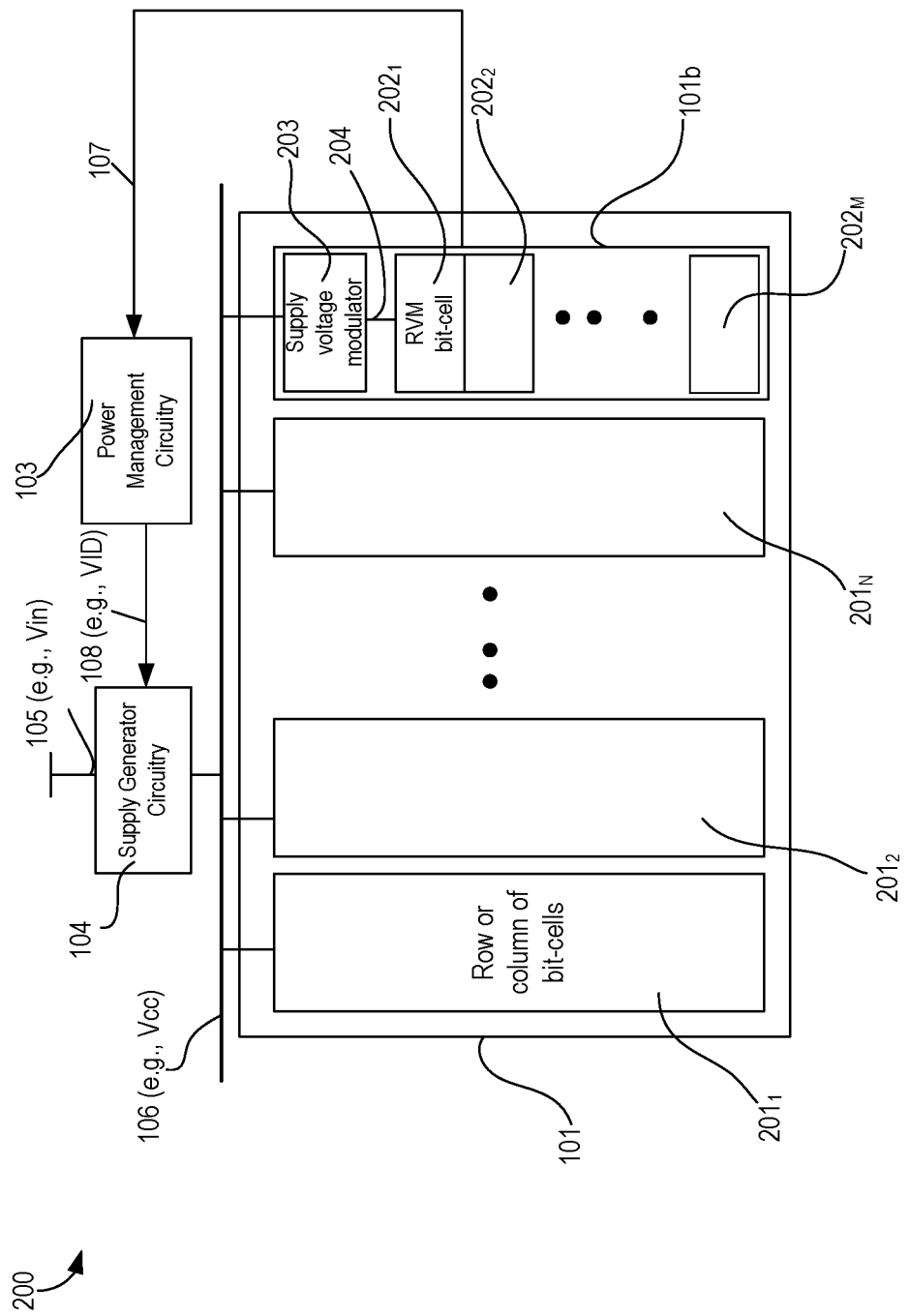
FIG. 2 illustrates a high level architecture of an adaptive voltage system with Retention Vmin Monitor (RVM) for a memory array, according to some embodiments of the disclosure.

FIG. 2 illustrates a high level architecture 200 of an adaptive voltage system with RVM for a memory array, according to some embodiments of the disclosure. It is pointed out that those elements of FIG. 2 having the same reference numbers (or names) as the elements of any other figure can operate or function in any manner similar to that described, but are not limited to such.

Architecture 200 provides a detailed view of memory 101. In this example, RVM circuitry 101b is integrated within memory array 101. Memory 101 comprises rows/columns of memory bit-cells $201_{1-N}$, where 'N' is an integer. In some embodiments, RVM circuitry 101b includes RVM bit-cells $202_{1-M}$, where 'M' is an integer (e.g., M=16). In some embodiments, RVM bit-cells $202_{1-M}$ have the same circuitry as a memory bit-cell. For example, when a memory bit-cell is a 6T SRAM bit-cell, RVM bit-cell is also a 6T bit-cell. In some embodiments, RVM circuitry 101b includes a supply voltage modulator 203. In some embodiments, supply voltage modulator 203 receives a power supply from node 106 and modulates that power supply to stress the RVM bit-cells, and then to sample or sense the behavior of the stressed RVM bit-cells. For example, supply voltage modulator 203 receives voltage on node 106 and provides a supply 204 to RVM bit-cells $202_{1-M}$.

In some embodiments, RVM circuitry 101b tracks the retention Vmin of RVM bit-cells $202_{1-M}$ which is affected by aging of transistors and other variations. Adaptive voltage system 200 samples the RVM output 107 periodically. Aging is a slow changing behavior, and so periodically sampling here may much slower than a clock frequency of the chip. For example, adaptive voltage system 200 samples the RVM output 107 every other day. When RVM circuitry 101b detects the Vmin change due to the aging, it provides a warning signal via node 107 to PMU 103 to adapt Vcc on node 106 by supply generator 104. Here, the same stress conditions are applied for the RVM aging sensor 101b and the memory bit-cells $201_{1-N}$.

Here, storage cell failures are a function of manufacturing process variations that cause some transistors to age faster than other transistors. As such, having multiple RVM cells designed into a same semiconductor chip provides for a greater spread of RVM cell performance (e.g., some RVM cells will fail before other RVM cells), in accordance with some embodiments. The decision point as to when the supply voltage on node 106 should be raised because of RVM cell failure(s) can be a function of, for example, the number of RVM cells that have been observed to fail, in accordance with some embodiments.

For instance, if RVM cells $202_{1-M}$ are designed to be particularly weak during a measurement read (e.g., they have multiple pull-up transistors and a lowered read supply voltage), the decision to raise the supply voltage on node 106 may require failure of multiple RVM cells. In some embodiments, if RVM cells $202_{1-M}$ are designed to be less weak during a measurement read (e.g., only a small supply voltage drop is effected during a measurement read), the decision to raise the supply voltage may involve failure of fewer (e.g., just one) RVM cell from among RVM cells $202_{1-M}$.

In some embodiments, the performance of RVM cells $202_{1-M}$ is averaged together by tying their input and output nodes together. In some embodiments, each RVM cell is effectively coupled in parallel in that its input and output nodes are coupled to the same node. Coupling RVM cells $202_{1-M}$ in this manner allows for multiple mechanisms to trigger an error during a measurement read, which, in turn, reflects the overall performance of the set of RVM cells $202_{1-M}$, in accordance with some embodiments.

For example, in some embodiments, incorrect data may be read at the output if any of the following situations arise: more than half of RVM cells $202_{1-M}$ weakly fail (e.g., each cell only weakly pulls the output data nodes toward the wrong logic level but more than half of the cells pulling in this manner is sufficient to pull the entire data node to the wrong level), a few RVM cells $202_{1-M}$ fail with some strength (e.g., a few failing RVM cells pull the data output nodes with enough strength to over-ride the other correctly working RVM cells and place the output data nodes at the wrong logic level), or one RVM cell from among cells $202_{1-M}$ fails with tremendous strength (e.g., the one cell pulls the data output node with enough strength to over-ride all the other RVM cells).

In some embodiments, one or more sense amplifiers (not shown) associated with RVM bit-cells $202_{1-M}$ in RVM circuitry 101b are to determine a logic state stored in the RVM bit-cells $202_{1-M}$ before and after the application of the voltage and/or current stress to RVM bit-cells $202_{1-M}$. As such, PMU 103 determines whether RVM bit-cells $202_{1-M}$ retained their data upon application of voltage and/or current stress through supply node 204.

FIGS. 3A-F illustrate RVM circuitries 300, 320, 330, 340, 350, and 360, respectively, according to various embodiments of the disclosure. It is pointed out that those elements of FIGS. 3A-F having the same reference numbers (or names) as the elements of any other figure can operate or function in any manner similar to that described, but are not limited to such. All RVM circuitries track aging trend of retention Vmin of array 101.

RVM circuitry 300 of FIG. 3A illustrates an embodiment of supply voltage modulator 203 as circuit 303. Here, circuit 303 comprises a p-type device MP coupled to nodes 106 and 204. In some embodiments, the gate terminal of the p-type device MP is coupled to ground. In some embodiments, when the p-type device MP is fully turned on (e.g., when its gate is connected to ground), RVM bit-cells $202_{1-M}$ are stressed by the full amount of Vcc from node 106. In some embodiments, the p-type device MP is expected to reveal that a problem of aging is imminent at about the same time that the actual memory cells $201_{1-N}$ begin to fail. As such, the sensitivity level of tracking aging by circuit 303 is low which may leave the system little time to adjust its memory supply voltage 106.

In another embodiment, the gate of the p-type device MP is coupled to a control node which biases the p-type device MP. In some embodiments, the control voltage on the control node affects the supply voltage on node 204 that is provided to RVM bit-cells $202_{1-M}$. For example, the control voltage on the control node merely weakly or modestly turns on the p-type device MP which increases its channel resistance thereby inducing a voltage drop across the p-type device MP. The voltage drop across the p-type device MP, in turn, lowers the supply voltage on node 204 that is applied to the storage cell. With a lowered supply voltage, the RVM cells $202_{1-M}$ exhibit failures before the actual storage cells $201_{1-N}$ in memory array 101. For example, the voltage margin of RVM cells $202_{1-M}$ is by design less than the voltage margin of the actual storage cells $201_{1-N}$ in the memory array 101.

However, because the RVM cells $202_{1-M}$ continuously receive the lower supply voltage, they may not be stressed to the same degree as the actual storage cells $201_{1-N}$ in the memory array 101 (which receive a higher supply from voltage from node 106 since their cells do not include the p-type device MP). The lesser stress received by RVM cells $202_{1-M}$ offsets its tendency to exhibit errors sooner because of its lesser supply voltage.

RVM circuitry 320 of FIG. 3B illustrates an embodiment of supply voltage modulator 203 as circuit 323 which comprises at least two p-type devices MP1 and MP2 coupled together in parallel, and controllable by two different control signals provided on nodes 325 and 324 respectively. RVM circuitry 320 combines the two embodiments of RVM circuitry 300 in which one p-type device MP1 is controlled by an analog signal provided to node 325 while the other device p-type MP2 is digitally controlled. In some embodiments, PMU 103 applies voltage stress to the RVM bit-cells $202_{1-M}$ by turning on p-type device MP2 324. In some embodiments, PMU 103 senses the retention capability of RVM cells $202_{1-M}$ by turning off p-type device MP2 and providing an analog voltage to the gate terminal of p-type device MP1 so that RVM bit-cells $202_{1-M}$ are more sensitive to retention failure. The more sensitive the sensing mechanism for retention failure, the earlier the detection of the failure is, in according with various embodiments. In some embodiments, a bias circuit (or a programmable voltage divider) is used to provide the bias voltage on node 325.

While the various embodiments here describe the supply voltage modulator 203 as having only p-type transistors, in some embodiments n-type transistors may also be used alone or in combination of p-type transistors to provide voltage stress to the bit-cells and to then sense the retention failures. Further, the illustration of a single transistor can be replaced with multiple transistors coupled in parallel and controllable to be turned on to adjust the stress level and/or the retention sensitivity level, in accordance with various embodiments.

Figure 3D:
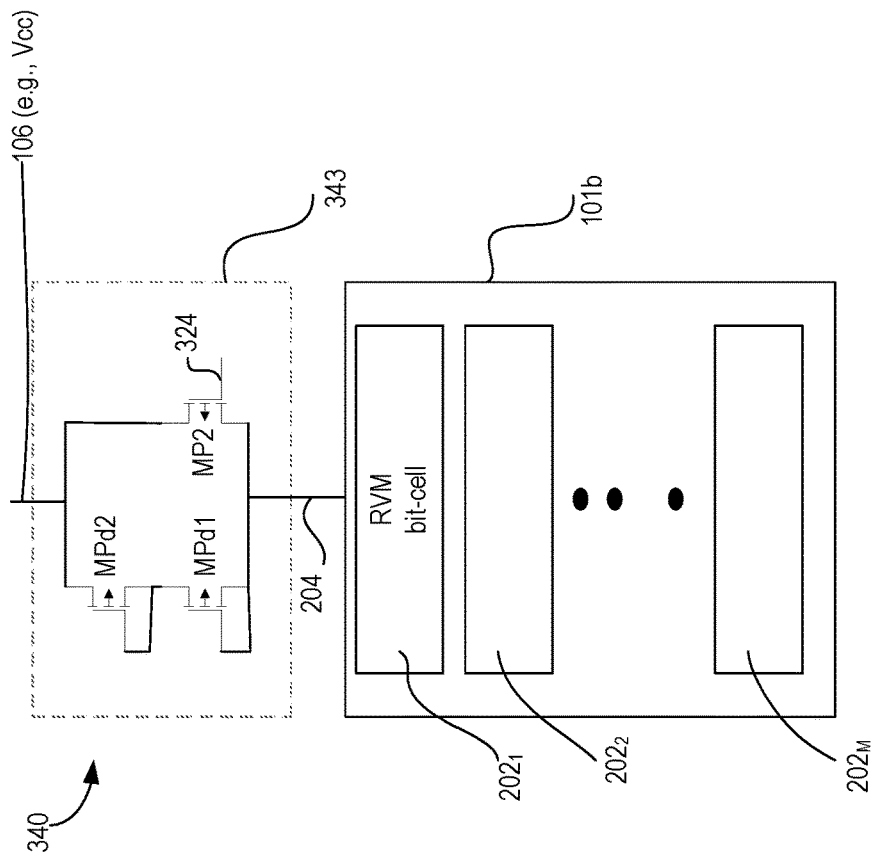
Figure 3C:
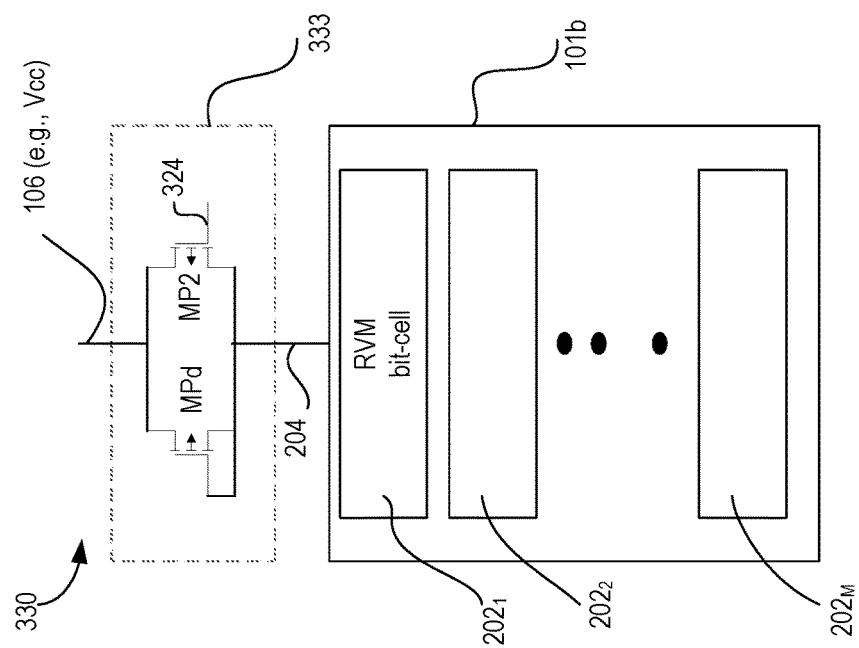

RVM circuitry 330 of FIG. 3C illustrates an embodiment of supply voltage modulator 203 as circuit 333 which comprises a diode-connected device MPd coupled in parallel to device MP2 which is controlled by node 324. In some embodiments, the diode-connected device MPd causes a forward bias voltage drop to occur on the supply voltage rail that feeds the RVM storage cells $201_{1-M}$ while their stored data are being read during a measurement or sampling mode.

In some embodiments, the supply voltage path to the RVM storage cells $201_{1-M}$ includes two electrical paths. The first path is through device MP2 that applies the full supply voltage to RVM storage cells $201_{1-M}$ to stress the cells approximately the same way the actual storage cells $201_{1-N}$ in the memory array 101 are being stressed. The second path is through the diode-connected device MPd that applies a lowered supply voltage to the RVM storage cells $201_{1-M}$ when it is being measured to understand, at current stress levels, if the lowered supply voltage is sufficiently low to cause RVM storage cells $201_{1-M}$ to fail to store their data correctly. If so, the RVM storage cells $201_{1-M}$ will have provided an "early warning" that the supply voltage has not yet reached, but will soon reach, a level where the cells $101_{1-N}$ of the memory array 101 will begin to exhibit errors. With a viable early warning indicator, the supply voltage can be raised before any cells in the memory array actually begin to fail.

In some embodiments, in the sampling mode, device MP2 is turned off to force the supply current to flow from node 106 to node 204 through diode-connected device MPd thereby inducing the aforementioned supply voltage drop. In some embodiments, the supply voltage drop induced by the diode-connected device MPd "weakens" the RVM cell's ability to keep its stored data, similar to the control device MP1 of FIG. 3B.

Referring back to FIG. 3C, in some embodiments, the RVM cells $202_{1-M}$ are merely weakened with a lesser supply voltage for the read operation performed during the measurement mode (also referred to as the sampling or sensing mode). In some embodiments, during the stress mode, RVM cells $202_{1-M}$ are not substantially supplied through the diode-connected device MPd but are instead supplied through the stress device MP2 which is strongly turned on while the RVM cells $202_{1-M}$ are being stressed. Because the stress device MP2 is strongly on during the stress mode, it has very low channel resistance and thereby negligible voltage drop across it, in accordance with some embodiments.

As such, during the stress mode, RVM cells $202_{1-M}$ receive the full Vcc supply voltage via node 204. As mentioned here, to measure the cell's stored data during (e.g., periodic) measurement modes in between extended stress times, the stress device MP2 is turned off which forces all supply current to flow through the diode-connected device MPd which weakens the cell by lowering its supply voltage during the read mode, in accordance with some embodiments.

RVM circuitry 340 of FIG. 3D illustrates an embodiment of supply voltage modulator 203 as circuit 343 which comprises two or more series coupled diode-connected devices MPd1 and MPd2, which are together coupled in parallel to device MP2 which is controlled by voltage/current on node 324. In this example, two diode-connected devices coupled in series are shown. However, more than two such devices can also be coupled in series to adjust the sensitivity level for retention failure.

Like RVM circuitry 330, RVM circuitry 340 induces a voltage drop along the supply voltage path during measurement read mode but induces even more supply voltage drop than the circuit of FIG. 3C, in accordance with some embodiments. For example, whereas RVM circuitry 330 of FIG. 3C induces one forward bias voltage drop along the supply rail during a test mode, by contrast, RVM circuitry 340 induces two forward bias voltage drops along the supply rail during a test mode by way of a pair of diode-connected devices MPd1 and MPd2. As such, RVM circuitry 340 may provide an even earlier warning signal than RVM circuitry 330, in accordance with some embodiments. While the embodiment of FIG. 3D illustrates two diode-connected devices coupled in series, more diode connected devices may be cascoded in series to further increase the retention failure sensitivity.

Figure 3F:
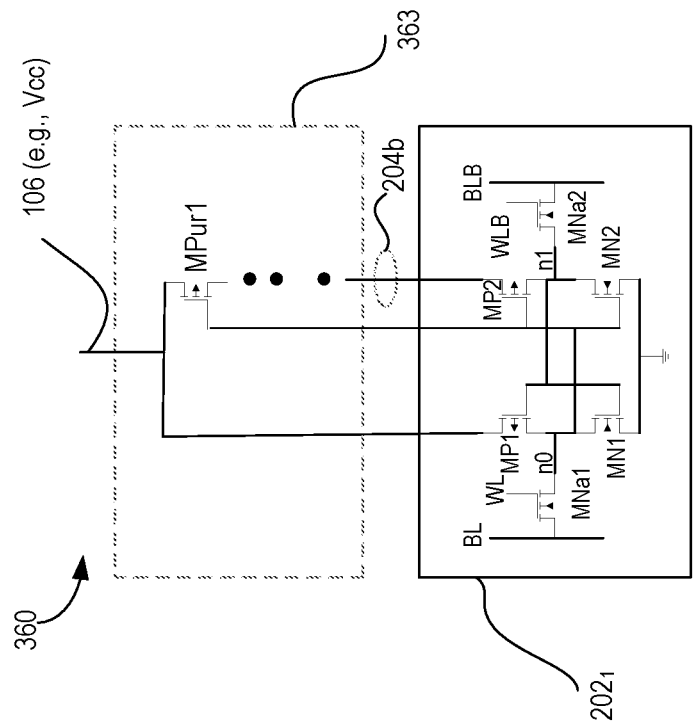
Figure 3E:
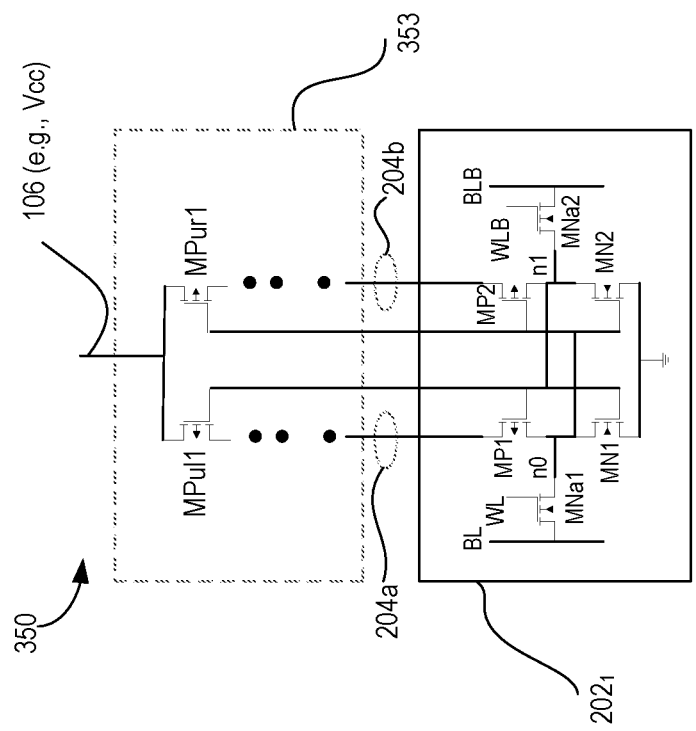

RVM circuitry 350 of FIG. 3E illustrates an embodiment of supply voltage modulator 203 as circuit 353 which comprises multiple pull-up devices (e.g., MPul1 and MPur1) along each leg (e.g., right and left legs) instead of merely a single pull-up transistor along each leg. Here, the term "leg" generally refers to the electrical path of transistors MP1 and MN1 of a RVM bit cell to ground or lower potential node, or electrical path of devices MP2 and MN2 of the RVM bit cell to ground or lower potential node. In this example, a 6T RVM bit-cell is shown, however, the embodiments are applicable to 4T SRAM, 8T SRAM, dual-port, or CAM bit-cell, etc. The 6T RVM bit-cell $202_1$ comprises bit-line BL, bit-line bar BLB (which provides a signal which is an inverse of the signal on BL), word line (WL), word line bar (WLB) (which provides a signal which is an inverse of the signal on WLB), access devices MNa1 and MNa2, cross-coupled inverting devices MP1, MN1, MP2, and MN2, and storage nodes n0 and n1 coupled together as shown.

In some embodiments, the more pull-up transistors that are chained together, the weaker their pull-up effect. As such, the output nodes n0 and n1 of RVM cell $202_1$ have a propensity to be pulled down rather than pulled-up, in accordance with some embodiments. If, for instance, the gain of the pull-up transistors 353 diminish through aging, the RVM cell $202_1$ may reach a point where one of its output nodes is not able to be pulled up to a logic high when a logic high at the output node corresponds to correctly stored data. Upon such a point being reached, RVM cell $202_1$ is failing which corresponds to a warning signal that the supply voltage on node 106 to memory array 101 should be raised soon.

In some embodiments, RVM circuitry 350 does not include a voltage drop along its supply rail (e.g., nodes 204a and 204b) during read mode. For example, RVM cell $202_1$ is weakened with extra pull-up transistors of circuitry 353 rather than with a lower supply voltage. As such circuitry 353 may not need two supply paths as with the approaches of FIGS. 3B-D. Referring back to FIG. 3E, in some embodiments, RVM cell $202_1$ is tied directly to the supply voltage, and so its constituent transistors are stressed in-step with the transistors of the actual storage cells $201_{1-N}$ in memory array 101.

RVM circuitry 360 of FIG. 3F illustrates an embodiment of supply voltage modulator 203 as circuit 363 which comprises multiple pull-up devices (e.g., device MPur1) along one leg. For example, multiple pull-up devices are coupled between nodes 106 and 204b. In some embodiments, RVM storage cell $202_1$ is differential in that the storage of data is effected by one leg keeping a logic high and the other leg keeping a logic low. For example, the operation of RVM storage cell $202_1$ can be viewed as being balanced. With merely one leg having multiple pull-up devices MPur1, the balanced nature of RVM storage cell $202_1$ may be adversely affected. For example, the leg having multiple pull-up transistors 363 may have less of an ability to pull-up its output node (n0 or n1) to a logic high than the leg having only one pull-up device (e.g., device MPup1).

With this imbalance or asymmetry, RVM storage cell $202_1$ may not be able to store a logic value that corresponds to a logic high value on the leg with multiple pull-up transistors (a first state) as reliably as it can store a logic value that corresponds to a logic low value on the leg with multiple pull-up transistors (a second state), in accordance with some embodiments. For example, RVM storage cell $202_1$ may have a tendency to stick in the second state rather than the first state. In some embodiments, RVM storage cell $202_1$ is loaded with data that corresponds to the first state and when RVM storage cell $202_1$ is observed to have flipped to the second state, the failure corresponds to an early warning sign that the supply voltage should be raised soon. In some embodiments, circuitry 363 may not need two supply paths as with the approaches of FIGS. 3B-D because RVM storage cell $202_1$ is tied directly to the supply voltage on node 106. As such, RVM storage cell $202_1$ transistors are stressed in-step with the transistors of the actual storage cells $201_{1-N}$ in memory array 101.

Some embodiments here are merely some of the ways in which an RVM storage cell can be weakened for its measurement read but will still be stressed at full supply voltage and that a vast number of other RVM cell designs may be utilized to achieve this particular objective of various embodiments.

Figure 4A:
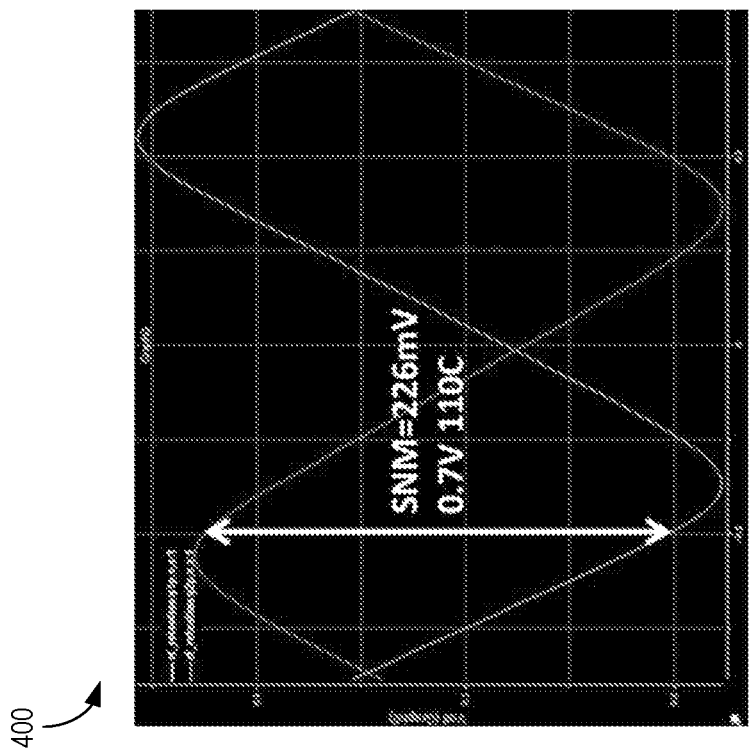
FIGS. 4A-B illustrate plots showing static noise margin (SNM) before and after aging, respectively.
Figure 4B:
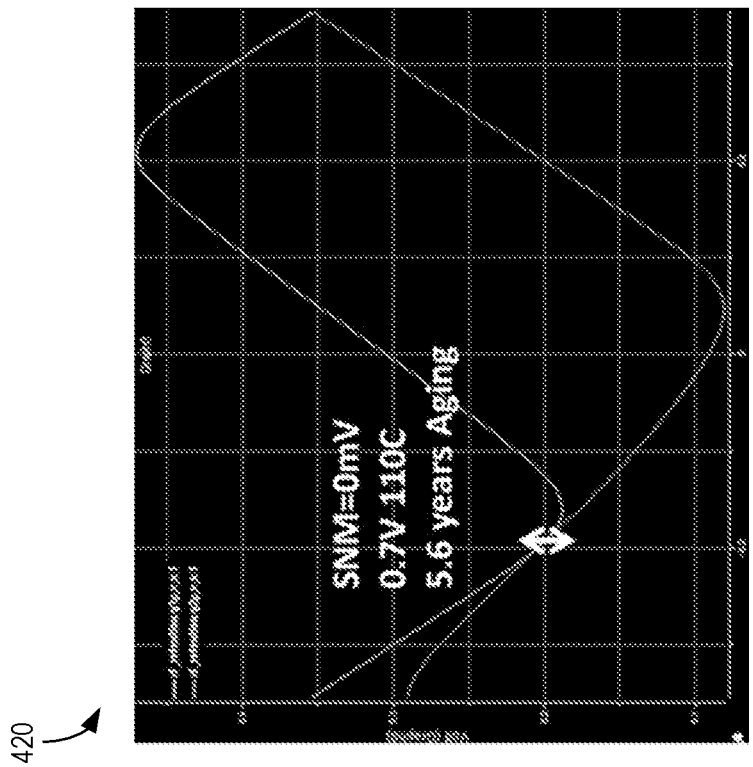

FIGS. 4A-B illustrate plots 400 and 420 showing static noise margin (SNM) before and after aging, respectively. FIG. 4A shows the SNM of 226 mV before aging at 0.7 V and 110° C. temperature, while FIG. 4B shows zero SNM of memory array 101 after 5.6 year aging which fails to retain the data in memory array 101. Various embodiments use RVM circuitry 101b to maintain a descent SNM over a lifetime of the IC.

Figure 5A:
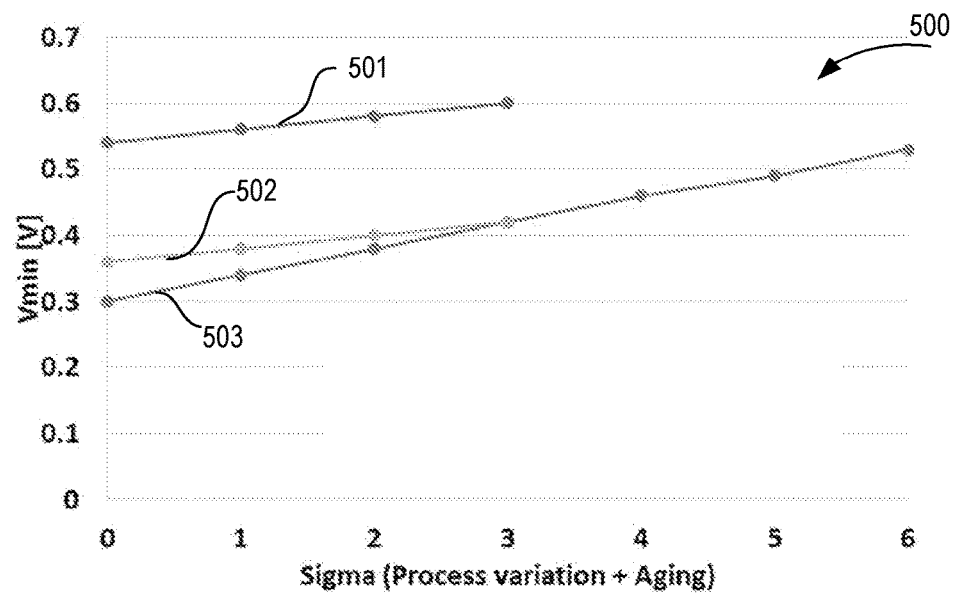
FIG. 5A illustrates a plot showing Vmin for a memory array across process variation and aging with and without RVM circuitries, according to some embodiments.

FIG. 5A illustrates plot 500 showing Vmin for a memory array across process variation and aging, according to some embodiments. Plot 500 shows that two retention Vmin monitors track retention Vmin of a memory array across process corner with small amount of difference (e.g., sigma). In this example, each RVM has different Vmin tracking. Waveform 501 is the Vmin for a two stack diode-connected RVM (e.g., FIG. 3D), waveform 502 is the Vmin for a one stack diode-connected RVM (e.g., FIG. 3C), and waveform 503 is the Vmin for a memory bit-cell (e.g., $201_1$). Based on the simulation results, 2-stacked diode-connected RVM shows better tracking with the smallest margin across process and aging variation. Here, the 2-stack diode-connected RVM (e.g., FIG. 3D) with 0 to approximate 3 sigma has little higher Vmin than Vmin of bit-cell with 6 sigma.

Figure 5B:
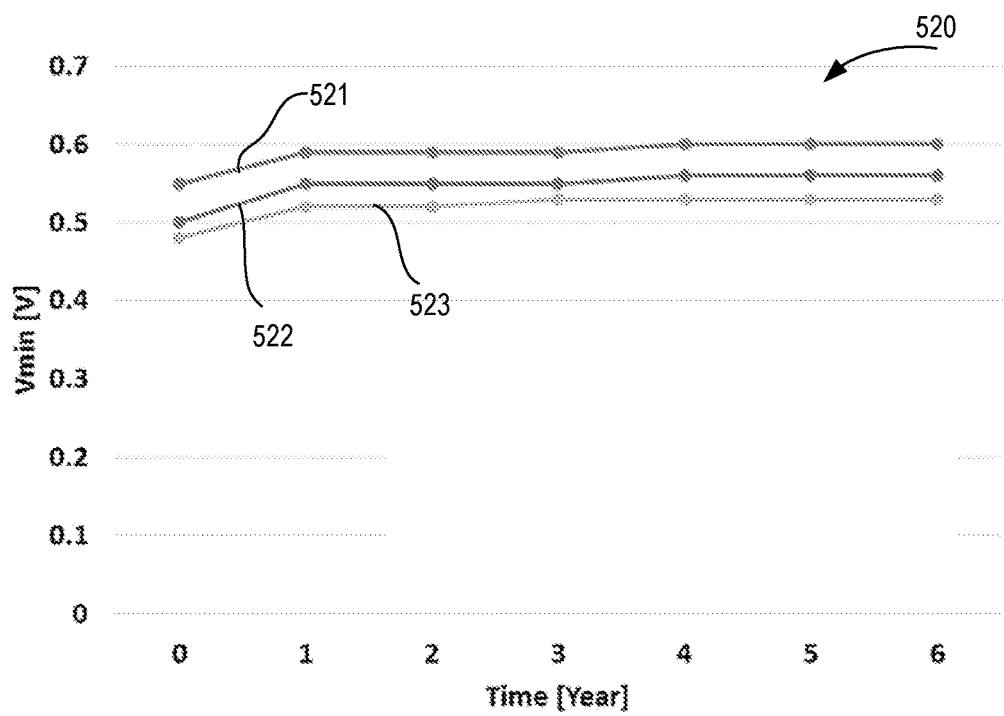
FIG. 5B illustrates a plot showing Vmin with aging period for a memory bit-cell and a two stack diode-connected RVM, according to some embodiments.

FIG. 5B illustrates plot 520 showing Vmin with aging period for a memory bit-cell and two stack diode-connected RVM, according to some embodiments. Waveform 521 is the Vmin for a two stack diode-connected RVM (e.g., FIG. 3D) with signal 3, waveform 522 is the Vmin for a two stack diode-connected RVM (e.g., FIG. 3D) with sigma 1, and waveform 523 is the Vmin for a memory bit cell (e.g., $201_1$). Plot 520 shows the Vmin trend with 2-stacked diode-connected RVM and array 101, where Vmin of RVM and array increases over years. Here, RVM tracks retention Vmin of array well across process corner.

Figure 6:
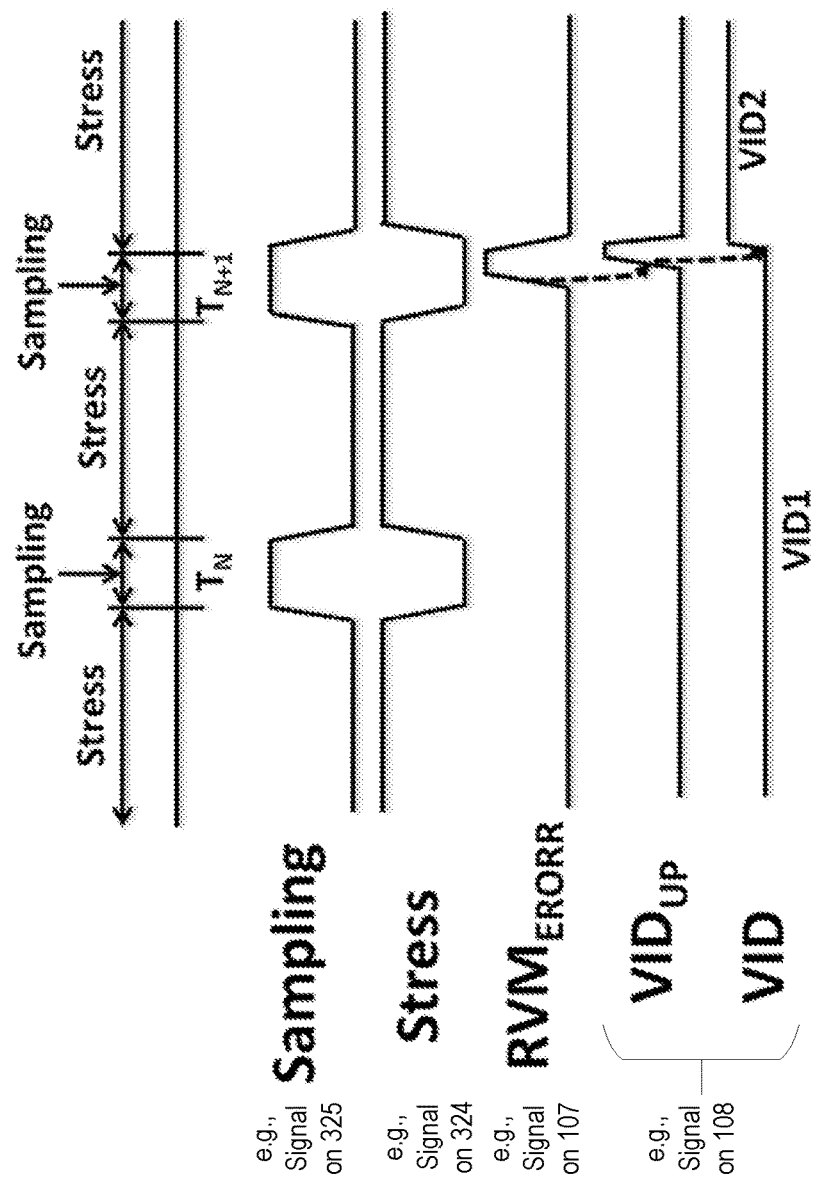
FIG. 6 illustrates a plot with waveforms showing sampling and stress timing diagram, according to some embodiments of the disclosure.

FIG. 6 illustrates plot 600 with waveforms showing sampling and stress timing diagram, according to some embodiments of the disclosure. It is pointed out that those elements of FIG. 6 having the same reference numbers (or names) as the elements of any other figure can operate or function in any manner similar to that described, but are not limited to such. Here, x-axis is time and y-axis for each waveform is voltage. By choosing sampling and stress signal on p-type device header of RVM circuitry 203, an RVM bit-cell $202_1$ is stressed with full swing and sampling the retention Vmin of a bit-cell $202_1$ continuously. In some embodiments, when RVM error signals before array function fails, PMU 103 changes voltage level (e.g., by changing VID code) via 108 for voltage generator 104 until error signal on node 107 is gone.

Figure 7A:
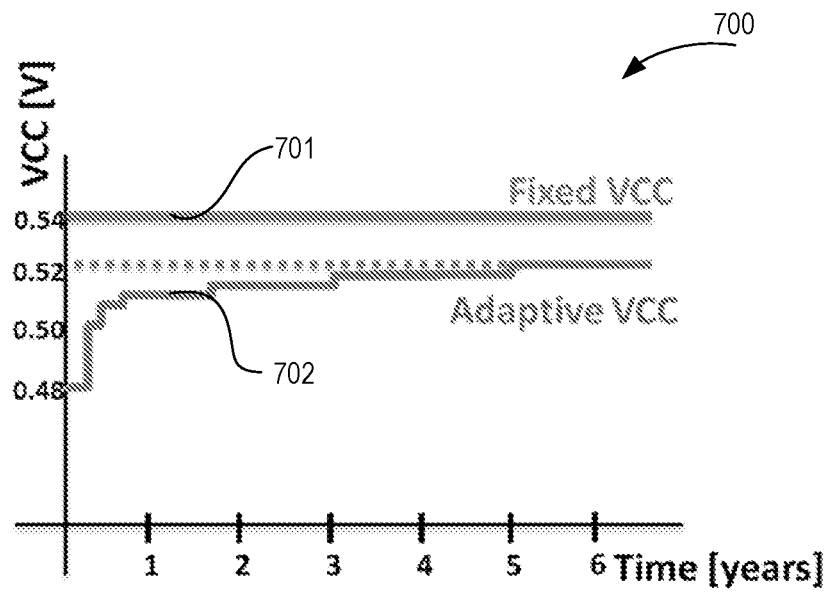
FIGS. 7A-B illustrate plots showing power savings using the RVM circuitries of some embodiments.
Figure 7B:
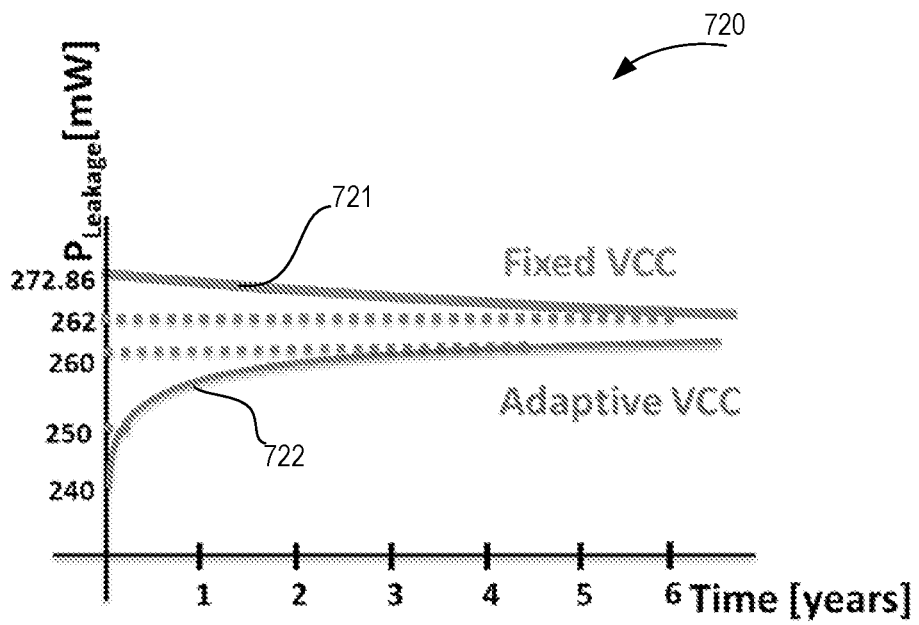

FIGS. 7A-B illustrate plots 700 and 720 showing power savings using the RVM circuitries of various embodiments, respectively. Plot 700 shows fixed Vcc 701 and adaptive Vcc on node 106 over time as regulated using RVM circuitry 101b via PMU 103 and supply generator 104. Plot 720 illustrates the corresponding power associated with fixed Vcc 721 and adaptive Vcc 722 on node 106. Adaptive voltage scaling (AVS) of various embodiments can start lower Vcc than fixed Vcc scenario which deposits aging guardband or margin from the beginning. Because of lower Vcc starting, AVS consumes less power during entire usage of the IC, in accordance with some embodiments.

Figure 8:
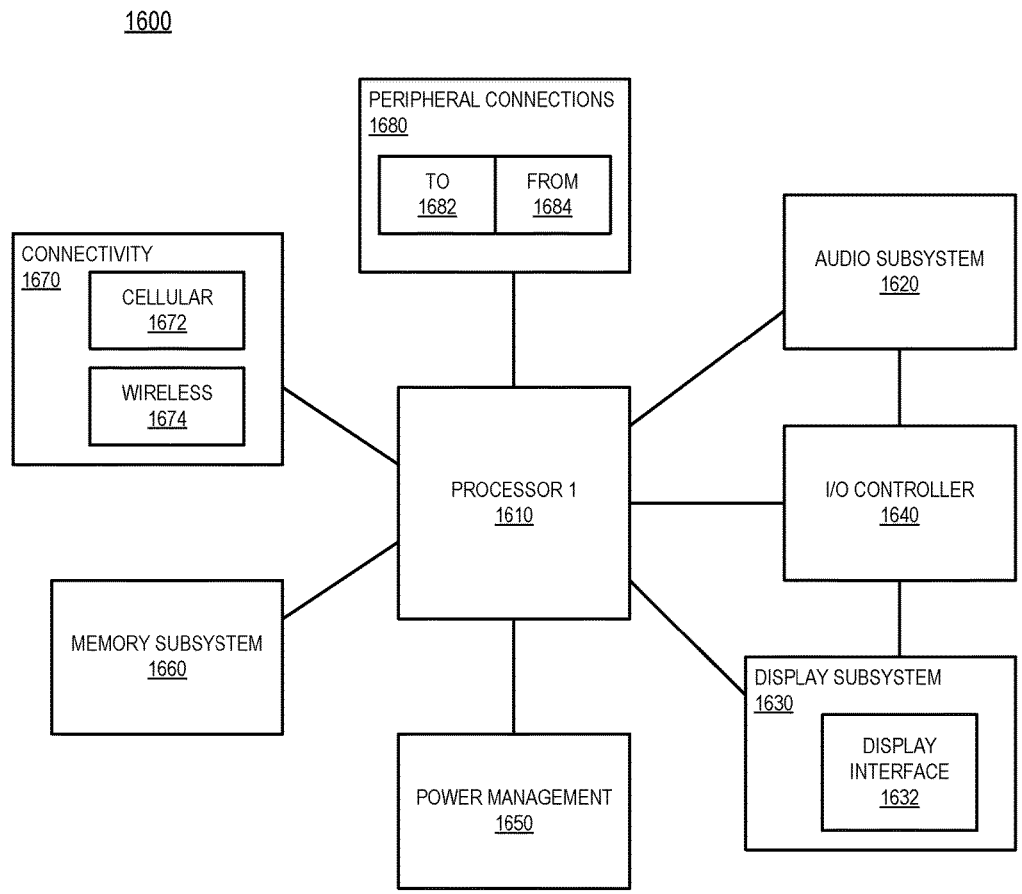
FIG. 8 illustrates a smart device or a computer system or a SoC (System-on-Chip) with the adaptive voltage system, according to some embodiments.

FIG. 8 illustrates a smart device or a computer system or a SoC (System-on-Chip) with the adaptive voltage system, according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with the adaptive voltage system, according to some embodiments discussed. Other blocks of the computing device 1600 may also include the adaptive voltage system, according to some embodiments. In some embodiments, the entire SoC is provided with the adaptive voltage system. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. Various embodiments here can be can be combined with any of the other embodiments thereby allowing various combinations.

Example 1 is an apparatus which comprises: a first power supply node; a second power supply node; a memory bit-cell coupled to the second power supply node; a circuitry coupled to the first and second power supply nodes, the circuitry to operate in a diode-connected mode; and a transistor coupled in parallel to the circuitry, wherein the transistor is controllable by a digital signal such that when the transistor is to turn on, it is to apply voltage and/or current stress to the memory bit-cell.

Example 2 includes all features of example 1, wherein the apparatus of example 2 comprises a power management circuitry to generate the digital signal such that the transistor is to turn on in a low power mode or retention mode, and to turn off in a normal mode or active mode.

Example 3 includes all features of example 2, wherein the apparatus of example 2 comprises a sense amplifier to determine a logic state stored in the memory bit-cell before and after the application of the voltage and/or current stress to the memory bit-cell.

Example 4 includes all features of example 3, wherein the apparatus of example 4, comprises a voltage regulator coupled to the power management circuitry, wherein the voltage regulator is to provide a power supply to the first power supply node.

Example 5 includes all features of example 4, wherein the power management circuitry is to instruct the voltage regulator to adjust the power supply according to an output of a sense amplifier associated with the memory bit-cell.

Example 6 includes all features of example 5, wherein the power management circuitry is to adjust a value of a voltage identification (VID) code to adjust the power supply.

Example 7 is according to any one of examples 2 to 6, wherein the power management circuitry is to cause a power supply on the first power supply node to rise gradually over time.

Example 8 is according to any one of examples 1 to 6, wherein the memory bit-cell is a static random access memory bit-cell.

Example 9 is according to any one of examples 1 to 6, wherein the circuitry comprises one of: a stack of diode-connected transistors, or a single diode-connected transistor.

Example 10 is according to any one of examples 1 to 6, wherein the circuitry and the transistor are shared by a column of memory bit-cells, and wherein the column of memory bit-cells are to provide an early detection of memory failure during standby or retention mode.

Example 11 is an apparatus which comprises: a first power supply node; and a retention $V_{min}$ monitor (RVM) coupled to a memory, wherein the RVM is to detect an aging failure of the memory, wherein the RVM and the memory are coupled to the first power supply node, and wherein the RVM comprises: a memory bit-cell coupled to a second power supply node; a circuitry coupled to the first and second power supply nodes, the circuitry to operate in a diode-connected mode; and a transistor coupled in parallel to the circuitry, wherein the transistor is controllable by a digital signal such that when the transistor is to turn on, it is to apply voltage and/or current stress to the memory bit-cell.

Example 12 includes all features of example 11, wherein the apparatus of example 12 comprises a tunable replica bit (TRB) circuitry coupled to a memory, wherein the TRB circuitry is to detect timing margin for the memory.

Example 13 includes all features of example 12, wherein the apparatus of example 12 comprises a tunable replica circuit (TRC) coupled to a logic block, wherein the TRC is to detect a timing margin and error in advance for the logic block, wherein the logic block and the TRC are coupled to the first power supply node.

Example 14 includes all features of example 13, wherein the apparatus of example 13 comprises a power management logic communicatively coupled to the TRB circuitry, TRC, and RVM.

Example 15 includes all features of example 14, wherein the apparatus of example 14 comprises a voltage regulator coupled to the power management logic, wherein the power management logic is to cause the voltage regulator to modulate a power supply provided to the first power supply node according to outputs of the TRB, TRC, and RVM.

Example 16 is a system which comprises: a voltage regulator; a power management logic coupled to the voltage regulator; a first power supply node coupled to the voltage regulator; and a processor coupled to the first power supply node and the power management logic, wherein the processor includes a memory having a memory bit-cell coupled to the first and second power supply nodes, wherein the processor comprises: a circuitry coupled to the first and second power supply nodes, the circuitry to operate in a diode-connected mode; and a transistor coupled in parallel to the circuitry, wherein the transistor is controllable by a digital signal such that when the transistor is to turn on, it is to apply voltage and/or current stress to the memory bit-cell.

Example 17 includes all features of example 16, wherein the system of example 16 comprises a wireless interface to allow the processor to communicate with another device.

Example 18 includes all features of example 16, wherein the power management logic is to generate the digital signal such that the transistor is to turn on in a low power mode or retention mode, and to turn off in normal mode.

Example 19 includes all features of example 18, wherein the system of example 19 comprises a sense amplifier to determine a logic state stored in memory bit cell before and after the application of the voltage and/or current stress to the memory bit-cell.

Example 20 includes all features of example 19, wherein the power management circuitry is to instruct the voltage regulator to adjust power supply on the first power supply node according to an output of a sense amplifier associated with the memory bit-cell.

Example 21 includes all features of example 16, wherein the circuitry and the transistor are shared by a column of memory bit cells, and wherein the column of memory bit-cells are to provide an early detection of memory failure during standby mode.

Example 22 includes all features of example 16, wherein the voltage regulator is to provide a power supply to the first power supply node.

Example 23 includes all features of example 16, wherein the power management circuitry is to adjust a value of a voltage identification (VID) code to adjust power supply on the first power supply node.

Example 24 is a system which comprises: a memory; a processor coupled to the memory, the processor including an apparatus according to any one of examples 11 to 15; and wireless interface to allow the processor to communicate with another device.

Example 25 is a method which comprises: operating a circuitry in a diode-connected mode, wherein the circuitry is coupled to first and second power supply nodes, wherein the second power supply node is coupled to a memory bit-cell; and controlling a transistor by a digital signal such that when the transistor is to turn on, it is to apply voltage and/or current stress to the memory bit-cell.

Example 26 includes all features of 25, wherein the method of example 26 comprises generating the digital signal such that the transistor is to turn on in a low power mode or retention mode, and to turn off in a normal mode or active mode.

Example 27 includes all features of example 26, wherein the method of example 27 comprises determining a logic state stored in the memory bit-cell before and after the application of the voltage and/or current stress to the memory bit-cell.

Example 28 includes all features of example 27, wherein the method of example 28 comprises: providing a power supply to the first power supply node.

Example 29 includes all features of example 28, wherein the method of example 29 comprises instructing a voltage regulator to adjust the power supply according to determined logic state associated with the memory bit-cell.

Example 30 includes all features of example 29, wherein the method of example 30 comprises adjusting a value of a voltage identification (VID) code to adjust the power supply.

Example 31 includes all features of example 25, wherein the method of example 31 comprises causing a power supply on the first power supply node to rise gradually over time.

Example 32 is according to any one of examples 25 to 31, wherein the memory bit-cell is a static random access memory bit-cell.

Example 33 is according to any one of examples 25 to 31, wherein the circuitry comprises one of: a stack of diode-connected transistors, or a single diode-connected transistor.

Example 34 is according to any one of examples 25 to 31, wherein the circuitry and the transistor are shared by a column of memory bit-cells, and wherein the column of memory bit-cells are to provide an early detection of memory failure during standby or retention mode.

Example 35 is an apparatus which comprises: means for operating a circuitry in a diode-connected mode, wherein the circuitry is coupled to first and second power supply nodes, wherein the second power supply node is coupled to a memory bit-cell; and means for controlling a transistor by a digital signal such that when the transistor is to turn on, it is to apply voltage and/or current stress to the memory bit-cell.

Example 36 includes all features of example 35, wherein the apparatus of example 36 comprises: means for generating the digital signal such that the transistor is to turn on in a low power mode or retention mode, and to turn off in a normal mode or active mode.

Example 37 includes all features of example 36, wherein the apparatus of example 37 comprises means for determining a logic state stored in the memory bit-cell before and after the application of the voltage and/or current stress to the memory bit-cell.

Example 38 includes all features of example 37, wherein the apparatus of example 38 comprises: means for providing a power supply to the first power supply node.

Example 39 includes all features of example 38, wherein the apparatus of example 39 comprises: means for instructing a voltage regulator to adjust the power supply according to determined logic state associated with the memory bit-cell.

Example 40 includes all features of example 39, wherein the apparatus of example 40 comprises means for adjusting a value of a voltage identification (VID) code to adjust the power supply.

Example 41 includes all features of example 35, wherein the apparatus of claim 41 comprises: means for causing a power supply on the first power supply node to rise gradually over time.

Example 42 is according to any one of examples 35 to 41, wherein the memory bit-cell is a static random access memory bit-cell.

Example 43 is according to any one of examples 35 to 41, wherein the circuitry comprises one of: a stack of diode-connected transistors, or a single diode-connected transistor.

Example 44 is according to any one of examples 35 to 41, wherein the circuitry and the transistor are shared by a column of memory bit-cells, and wherein the column of memory bit-cells are to provide an early detection of memory failure during standby or retention mode.

Example 45 is a system which comprises: a memory; a processor coupled to the memory, the processor having an apparatus according to any one of examples 35 to 44; and a wireless interface to allow the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first power supply node;
   a second power supply node;
   a memory bit-cell coupled to the second power supply node;
   circuitry coupled to the first and second power supply nodes, wherein the circuitry is to operate in a diode-connected mode;
   a transistor coupled in parallel to the circuitry, wherein the transistor is controllable by a digital signal such that when the transistor is to turn on, it is to apply voltage and/or current stress to the memory bit-cell; and
   a sense amplifier to determine a logic state stored in the memory bit-cell before and after the application of the voltage and/or current stress to the memory bit-cell, wherein an output of the sense amplifier is to indicate an early detection of memory failure during a standby or retention mode.

2. The apparatus of claim 1, further comprising a power management circuitry to generate the digital signal such that the transistor is to turn on in a low power mode or retention mode, and to turn off in an active mode.

3. The apparatus of claim 2, further comprising a voltage regulator coupled to the power management circuitry, wherein the voltage regulator is to provide a power supply to the first power supply node.

4. The apparatus of claim 3, wherein the power management circuitry is to instruct the voltage regulator to adjust the power supply according to an output of the sense amplifier associated with the memory bit-cell.

5. The apparatus of claim 4, wherein the power management circuitry is to adjust a value of a voltage identification (VID) code to adjust the power supply.

6. The apparatus of claim 2, wherein the power management circuitry is to cause a power supply on the first power supply node to rise over time.

7. The apparatus of claim 1, wherein the memory bit-cell is a static random access memory bit-cell.

8. The apparatus of claim 1, wherein the circuitry comprises one of: a stack of diode-connected transistors, or a single diode-connected transistor.

9. The apparatus of claim 1, wherein the circuitry and the transistor are shared by a column of memory bit-cells.

10. An apparatus comprising:
    a first power supply node; and
    a retention $V_{min}$ monitor (RVM) coupled to a memory, wherein the RVM is to detect an aging failure of the memory, wherein the RVM and the memory are coupled to the first power supply node, and wherein the RVM comprises:
    a bit-cell coupled to a second power supply node;
    circuitry coupled to the first and second power supply nodes, wherein the circuitry is to operate in a diode-connected mode; and
    a transistor coupled in parallel to the circuitry, wherein the transistor is controllable by a digital signal such that when the transistor is to turn on, it is to apply voltage and/or current stress to the bit-cell.

11. The apparatus of claim 10, further comprising a tunable replica bit (TRB) circuitry coupled to the memory, wherein the TRB circuitry is to detect timing margin for the memory.

12. The apparatus of claim 11, further comprising a tunable replica circuit (TRC) coupled to a logic block, wherein the TRC is to detect a timing margin and error in advance for the logic block, and wherein the logic block and the TRC are coupled to the first power supply node.

13. The apparatus of claim 12, further comprising a power management circuitry communicatively coupled to the TRB circuitry, TRC, and RVM.

14. The apparatus of claim 13, further comprising a voltage regulator coupled to the power management logic, wherein the power management circuitry is to cause the voltage regulator to modulate a power supply provided to the first power supply node according to outputs of the TRB, TRC, and RVM.

15. A system comprising:
   a voltage regulator;
   a power management circuitry coupled to the voltage regulator;
   a first power supply node coupled to the voltage regulator; and
   a processor coupled to the first power supply node and the power management circuitry, wherein the processor includes a memory having a memory bit-cell coupled to the first and second power supply nodes, wherein the processor comprises:
      a circuitry coupled to the first and second power supply nodes, the circuitry to operate in a diode-connected mode;
      a transistor coupled in parallel to the circuitry, wherein the transistor is controllable by a digital signal such that when the transistor is to turn on, it is to apply voltage and/or current stress to the memory bit-cell; and
      a sense amplifier to determine a logic state stored in the memory bit-cell before and after the application of the voltage and/or current stress to the memory bit-cell, wherein an output of the sense amplifier is to indicate an early detection of failure of the memory during a standby or retention mode.

16. The system of claim 15, comprises a wireless interface to allow the processor to communicate with another device.

17. The system of claim 15, wherein the power management circuitry is to generate the digital signal such that the transistor is to turn on in a low power mode or retention mode, and to turn off in an active mode.

18. The system of claim 15, wherein the memory includes a column of memory bit cells, wherein the circuitry and the transistor are shared by the column of memory bit cells.

* * * * *